(12) United States Patent
Shepard et al.

(10) Patent No.: US 9,997,258 B2
(45) Date of Patent: Jun. 12, 2018

(54) USING NON-VOLATILE MEMORY BAD BLOCKS

(71) Applicant: SANDISK TECHNOLOGIES INC., Plano, TX (US)

(72) Inventors: Zachary Shepard, San Jose, CA (US); Rohit Sehgal, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days. days.

(21) Appl. No.: 15/150,765

(22) Filed: May 10, 2016

(65) Prior Publication Data

US 2017/0330635 A1    Nov. 16, 2017

(51) Int. Cl.
| | |
|---|---|
| *G11C 29/00* | (2006.01) |
| *G11C 16/06* | (2006.01) |
| *G11C 29/52* | (2006.01) |
| *G06F 11/10* | (2006.01) |
| *G11C 29/42* | (2006.01) |
| *G11C 29/44* | (2006.01) |
| *G11C 16/34* | (2006.01) |
| *G11C 29/04* | (2006.01) |

(52) U.S. Cl.
CPC .......... *G11C 29/88* (2013.01); *G06F 11/1048* (2013.01); *G11C 16/06* (2013.01); *G11C 29/42* (2013.01); *G11C 29/4401* (2013.01); *G11C 29/52* (2013.01); *G11C 29/76* (2013.01); *G11C 16/349* (2013.01); *G11C 2029/0409* (2013.01); *G11C 2029/4402* (2013.01)

(58) Field of Classification Search
CPC .......... G11C 29/76; G11C 29/52; G11C 16/06
See application file for complete search history.

(56) References Cited

U.S. PATENT DOCUMENTS

| | | | |
|---|---|---|---|
| 6,252,814 | B1 | 6/2001 | Tran |
| 7,535,764 | B2 | 5/2009 | Chin |
| 7,690,031 | B2 | 3/2010 | Ma |
| 7,881,114 | B2 | 2/2011 | Park |
| 8,111,548 | B2 | 2/2012 | Mokhlesi |

(Continued)

OTHER PUBLICATIONS

Young, et al., "Nonvolatile Memory System Storing System Data in Marginal Word Lines," U.S. Appl. No. 14/577,239, filed Dec. 19, 2014.

(Continued)

*Primary Examiner* — Vanthu Nguyen
(74) *Attorney, Agent, or Firm* — Vierra Magen Marcus LLP

(57) ABSTRACT

A system for using bad blocks in a memory system is proposed. The system includes accessing an identification of a plurality of bad blocks and corresponding error codes which, for example, were generated during a manufacturing test and stored on the memory integrated circuit. The system determines which blocks of the plurality of bad blocks to test for being still usable and which blocks of the plurality of bad blocks not to test for being still usable based on corresponding error codes. For each bad block that should be tested, a test from a plurality of tests is chosen based on the corresponding error code in order to determine if the bad block is still usable. Those blocks determined to be still usable are subsequently used to store non-mission critical information.

18 Claims, 15 Drawing Sheets

(56) References Cited

U.S. PATENT DOCUMENTS

| | | | |
|---|---|---|---|
| 8,498,153 B2* | 7/2013 | Seong | G11C 11/5628 |
| | | | 365/185.03 |
| 8,560,922 B2* | 10/2013 | Bivens | G11C 29/42 |
| | | | 714/763 |
| 8,732,519 B2 | 5/2014 | Sun | |
| 8,806,113 B2 | 8/2014 | Lasser | |
| 8,982,623 B2* | 3/2015 | Shirakawa | G11C 16/06 |
| | | | 365/185.08 |
| 9,418,751 B1* | 8/2016 | Dutta | G11C 16/0483 |
| 2011/0239065 A1 | 9/2011 | Byom | |
| 2012/0307561 A1 | 12/2012 | Joo | |
| 2013/0166831 A1 | 6/2013 | Atkisson | |
| 2013/0232289 A1 | 9/2013 | Zhong | |
| 2013/0254463 A1* | 9/2013 | Matsunaga | G06F 12/0246 |
| | | | 711/103 |
| 2013/0314995 A1 | 11/2013 | Dutta | |
| 2013/0326269 A1 | 12/2013 | Losh | |
| 2014/0279941 A1 | 9/2014 | Atkisson | |
| 2014/0281119 A1 | 9/2014 | Hyun | |
| 2016/0180926 A1 | 6/2016 | Young | |
| 2016/0266955 A1* | 9/2016 | Takeda | G06F 12/00 |

OTHER PUBLICATIONS

PCT International Search Report and Written Opinion of the International Searching Authority, dated Jul. 13, 2017, PCT Patent Application No. PCT/US2017/018548.

* cited by examiner

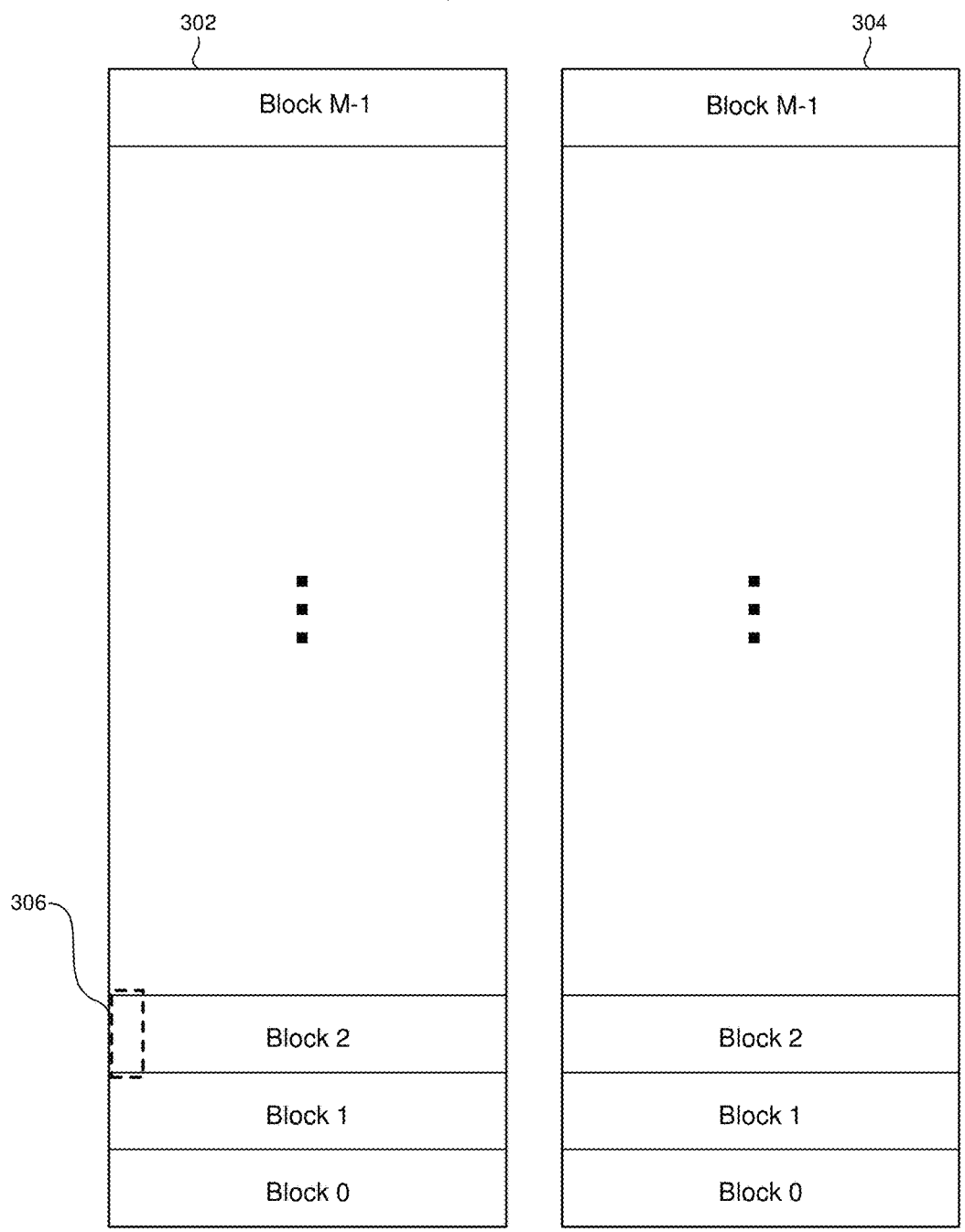

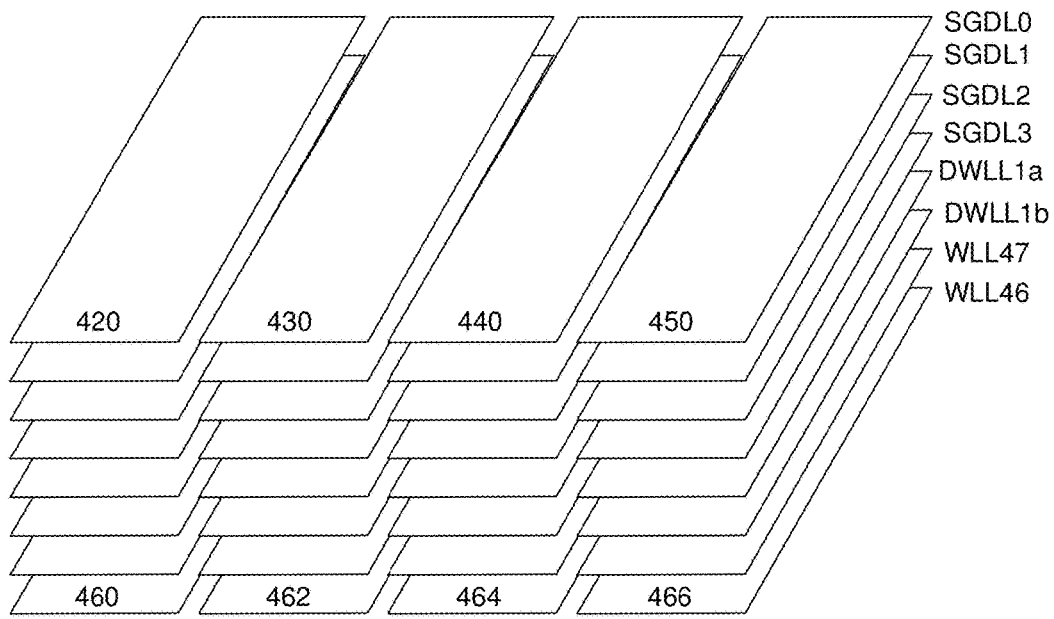
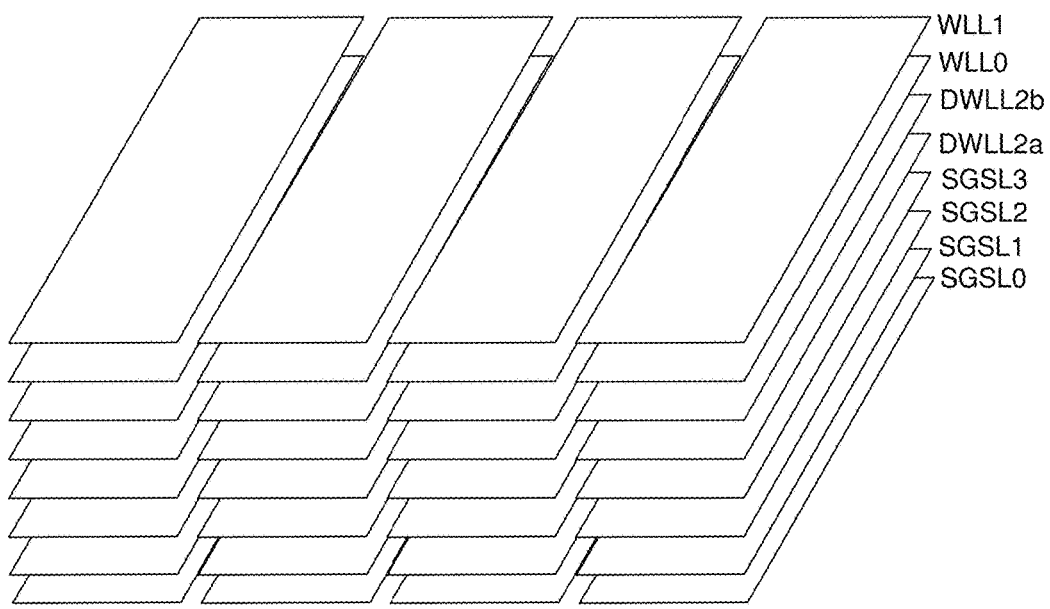
Figure 4D

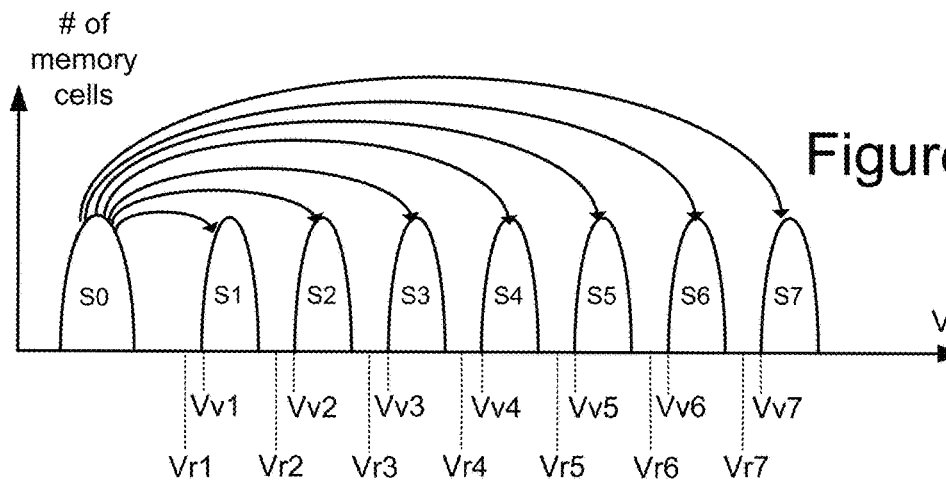
Figure 5
Figure 5A
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |
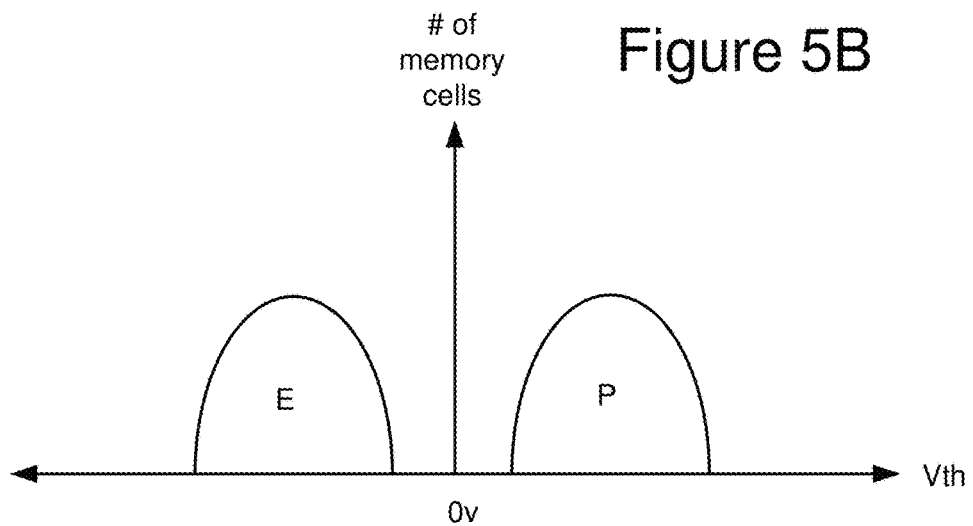
Figure 5B

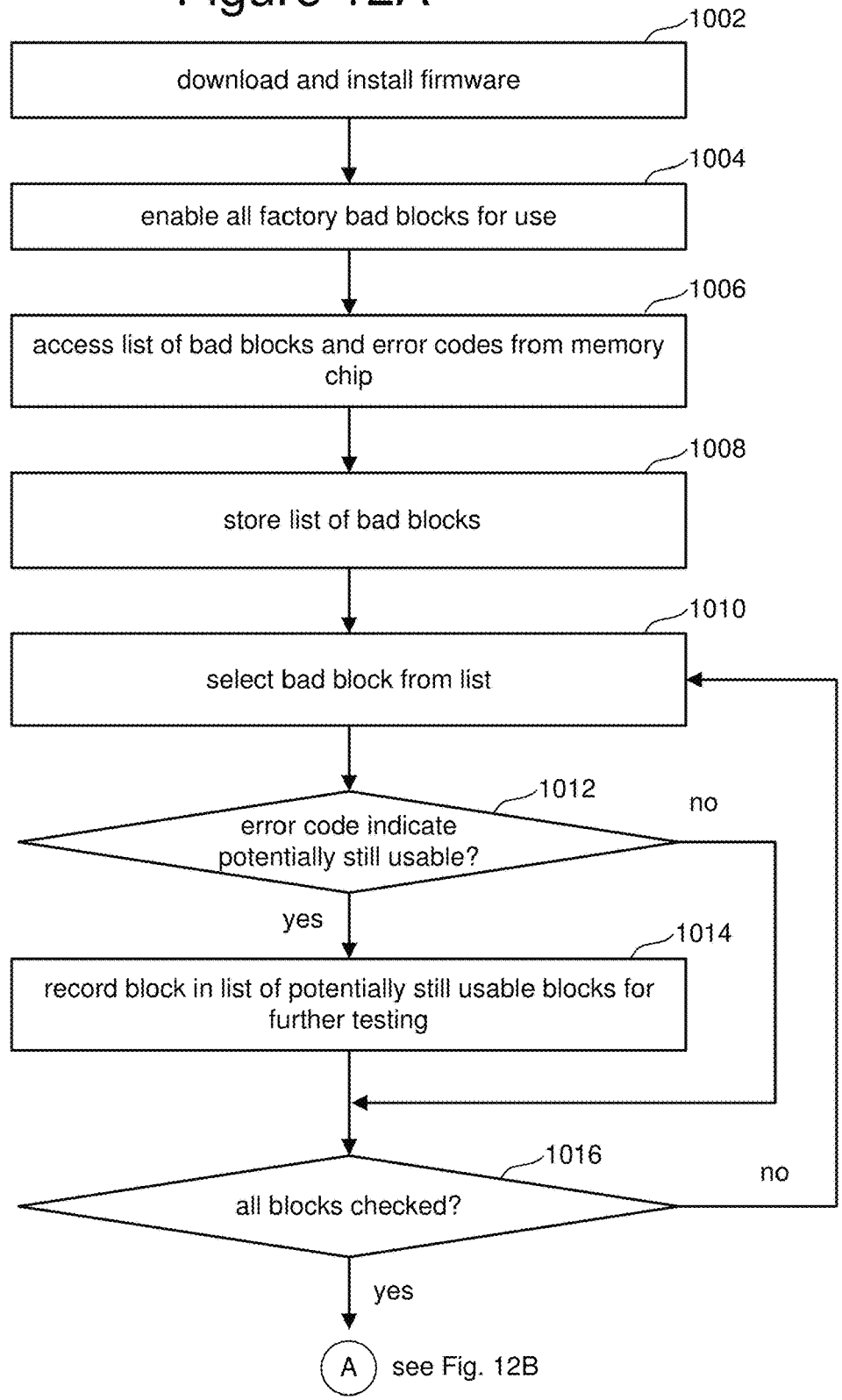

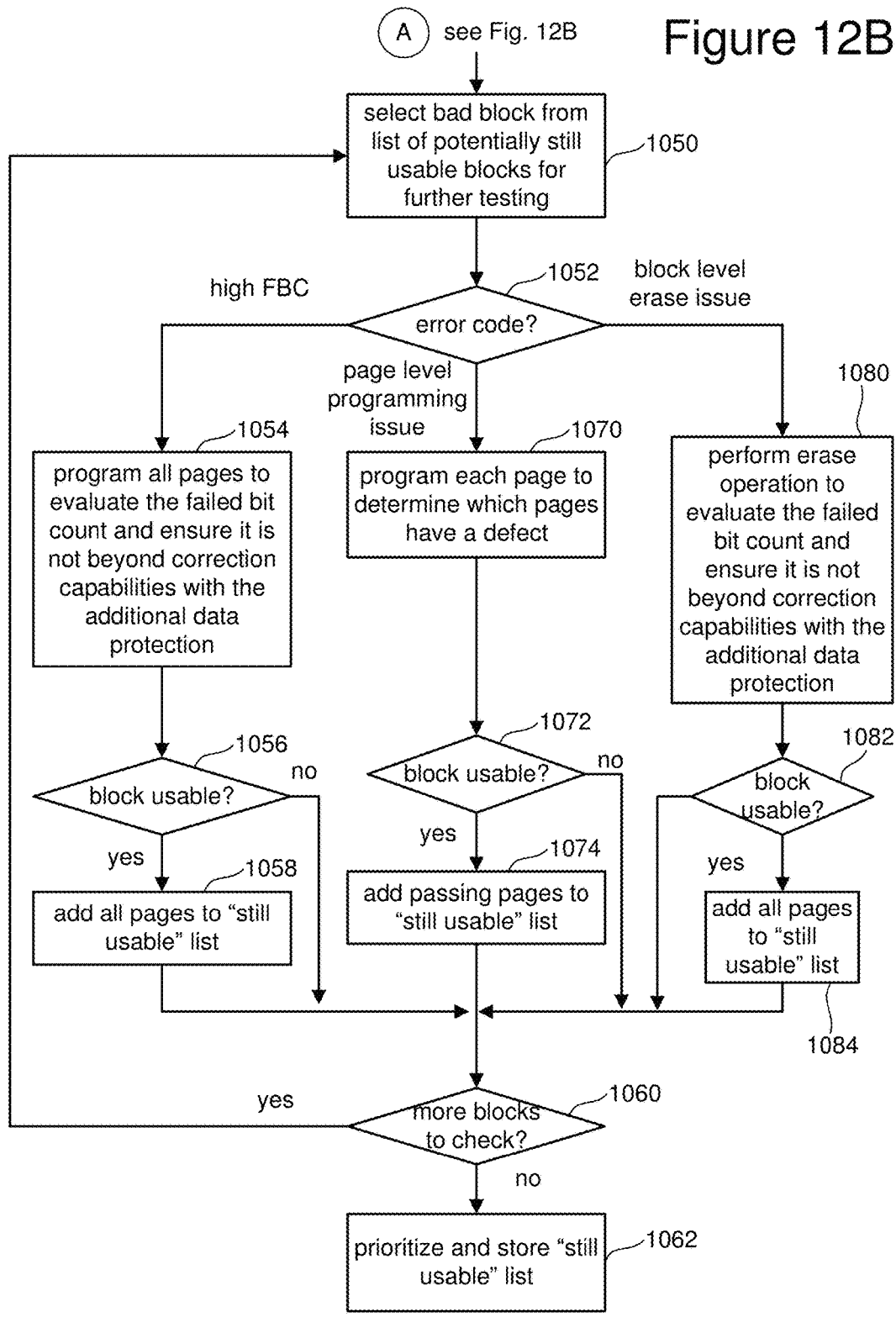

USING NON-VOLATILE MEMORY BAD BLOCKS

BACKGROUND

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some semiconductor memory systems generate non-mission critical information in order to help debug problems and understand usage to provide for more efficient operation. Non-mission critical information is data which is not required for normal device operation. Example of non-mission critical information include log information captured during operation of a memory system, device usage trends, statistical information and other information not used for direct system operation. The log information is typically captured by firmware running on the Controller, is used to diagnose failure conditions and other issues, and (in some embodiments) can include error information, temperature variances, error correction activity and other system activity. User data is not non-mission critical information.

Because there is a desire to deliver as much memory capacity to the end user, system designers are reluctant to make portions of the memory available for storing non-mission critical information

BRIEF DESCRIPTION OF THE DRAWINGS

Like-numbered elements refer to common components in the different figures.

FIG. 4A is a block diagram of a memory structure having two planes.

FIG. 4D depicts a view of the select gate layers and word line layers.

FIG. 5 depicts threshold voltage distributions.

FIG. 5A is a table describing one example of an assignment of data values to data states.

FIG. 5B depicts threshold voltage distributions.

FIGS. 12A and 12B depicts a flow chart describing one embodiment of a process for evaluating bad blocks.

DETAILED DESCRIPTION

It is proposed to use memory blocks that have been previously identified as bad blocks as a repository for non-mission critical information (or other information). Bad blocks are those portions of the memory that have been identified as defective and typically (in the past) retired from use.

One embodiment includes accessing an identification of a plurality of bad blocks and corresponding error codes which, for example, were generated during a manufacturing test and stored on the memory integrated circuit. The system determines which blocks of the plurality of bad blocks to test for being still usable and which blocks of the plurality of bad blocks not to test for being still usable based on corresponding error codes. For each bad block that should be tested, a test from a plurality of tests is chosen based on the corresponding error code in order to determine if the bad block is still usable. Those blocks determined to be still usable are subsequently used to store information. The following discussion provides details of one example of a suitable structure for memory devices that can used with the proposed technology. Other structures can also be used to implement the proposed technology.

Figure 1:
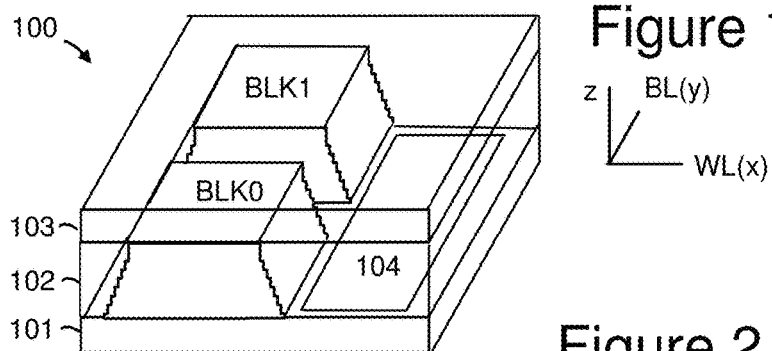
FIG. 1 is a perspective view of a 3D stacked non-volatile memory device.

FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
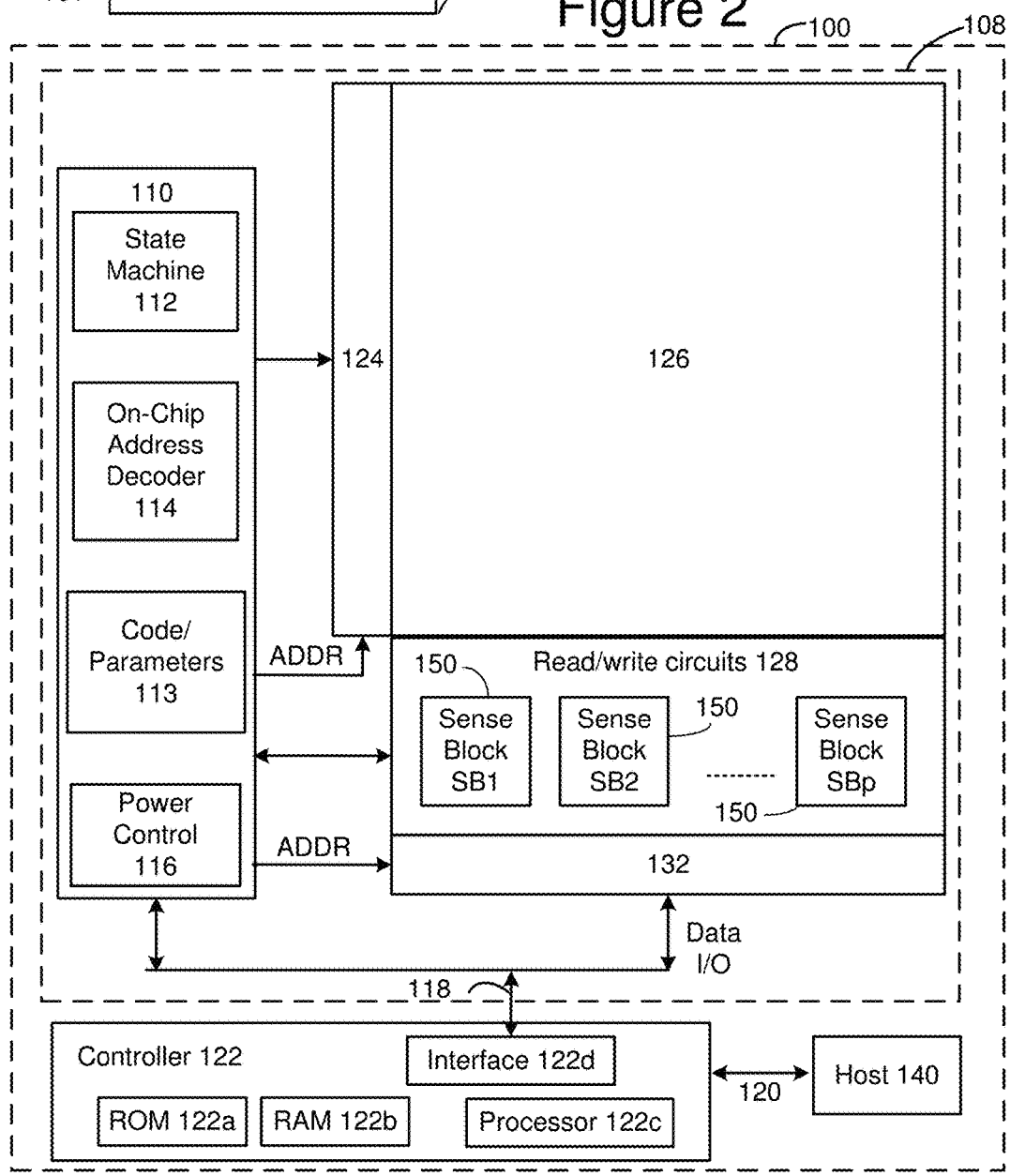
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a Controller 122 is included in the same memory device 100 (e.g., a removable storage card) as the one or more memory die 108. However, in other systems, the Controller can be separated from the memory die 108. In some embodiments the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Code and parameter storage 113 may be provided for storing operational parameters and software. In one embodiment, state machine 112 is programmable by the software stored in code and parameter storage 113. In other embodiments, state machine 112 does not use software and is completely implemented in hardware (e.g., electrical circuits).

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, code and parameter storage 113, power control module 116, sense blocks 150, read/write circuits 128, and Controller 122 can be considered one or more control circuits (or a managing circuit) that performs the functions described herein.

The (on-chip or off-chip) Controller 122 (which in one embodiment is an electrical circuit) may comprise a processor 122c, ROM 122a, RAM 122b and a Memory Interface 122d, all of which are interconnected. Processor 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions (e.g., firmware) to provide the functionality described herein. Alternatively or additionally, processor 122c can access code (e.g., firmware) from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
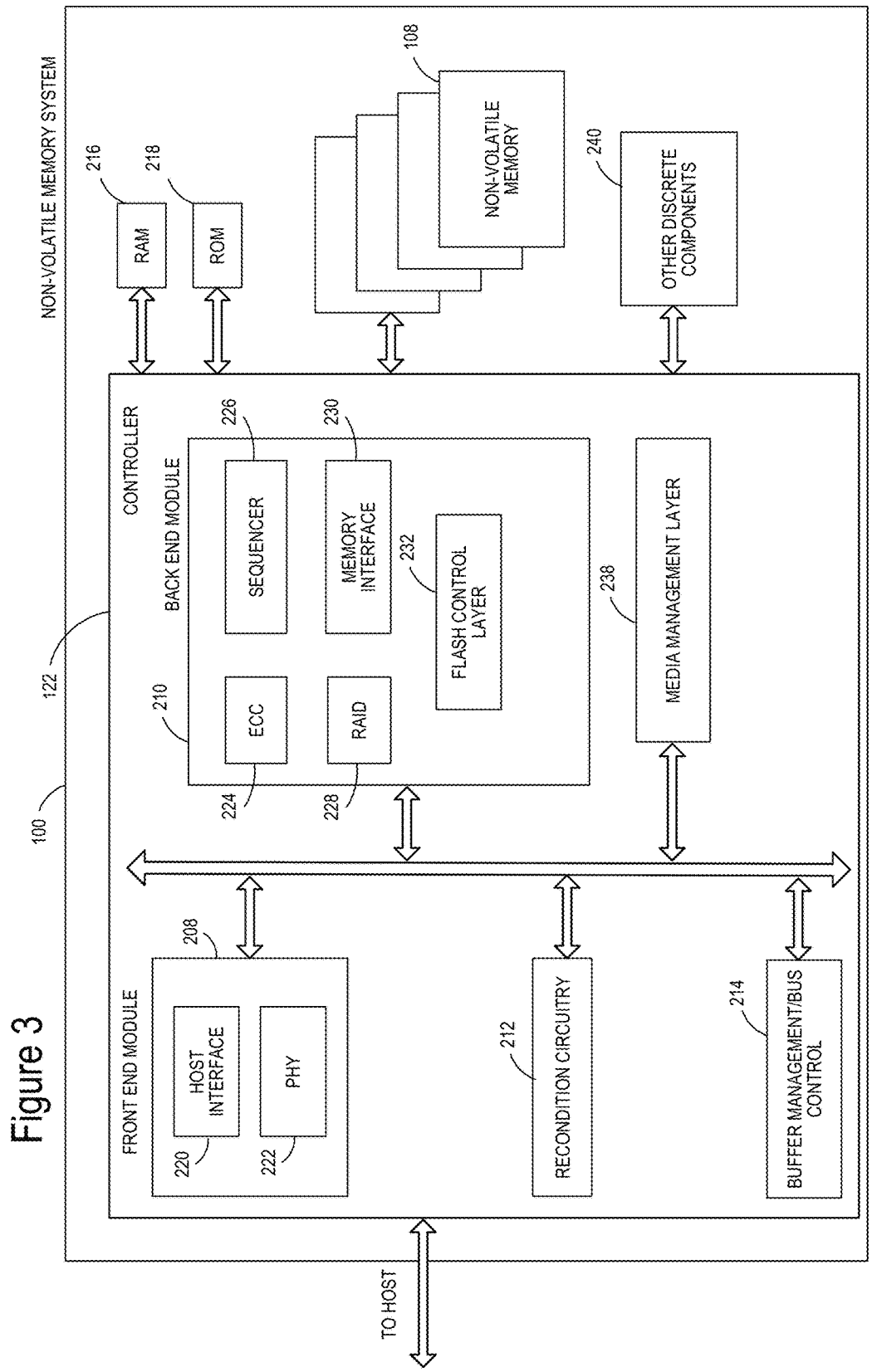
FIG. 3 is a block diagram depicting one embodiment of a Controller.

FIG. 3 is a block diagram of example memory system 100, depicting more details of Controller 122. As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 112 includes a front end module 208 that interfaces with a host, a back end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for Controller 122 to perform the functions described herein. The architecture depicted in FIG. 3 is one example implementation that may (or may not) use the components of Controller 122 depicted in FIG. 2 (ie RAM, ROM, processor, interface).

Controller 122 may include recondition circuitry 212, which is used for reconditioning memory cells or blocks of memory. The reconditioning may include refreshing data in its current location or reprogramming data into a new word line or block as part of performing erratic word line maintenance, as described below.

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die. In some embodiments, RAM 216 is used to store firmware that operates Controller 122. Even when relying on firmware for operation, Controller 122 is an electrical circuit (ie Controller circuit) that uses code to operate.

Front end module 208 includes a host interface 220 and a physical layer interface (PHY) 222 that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction Controller (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR)

interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In in one embodiment, Controller 122 and multiple memory dies (together comprising non-volatile storage system 100) implement a solid state drive (SSD), which can emulate, replace or be used instead of a hard disk drive inside a host, as a NAS device, etc. Additionally, the SSD need not be made to work as a hard drive.

In one embodiment, as discussed below with respect to FIGS. 7-12B, Controller 122 determines candidate bad blocks to test for usability based on previously recorded error codes, causes testing of the candidate bad blocks for usability, and causes storage of information in candidate blocks determined to be still usable.

Figure 4:
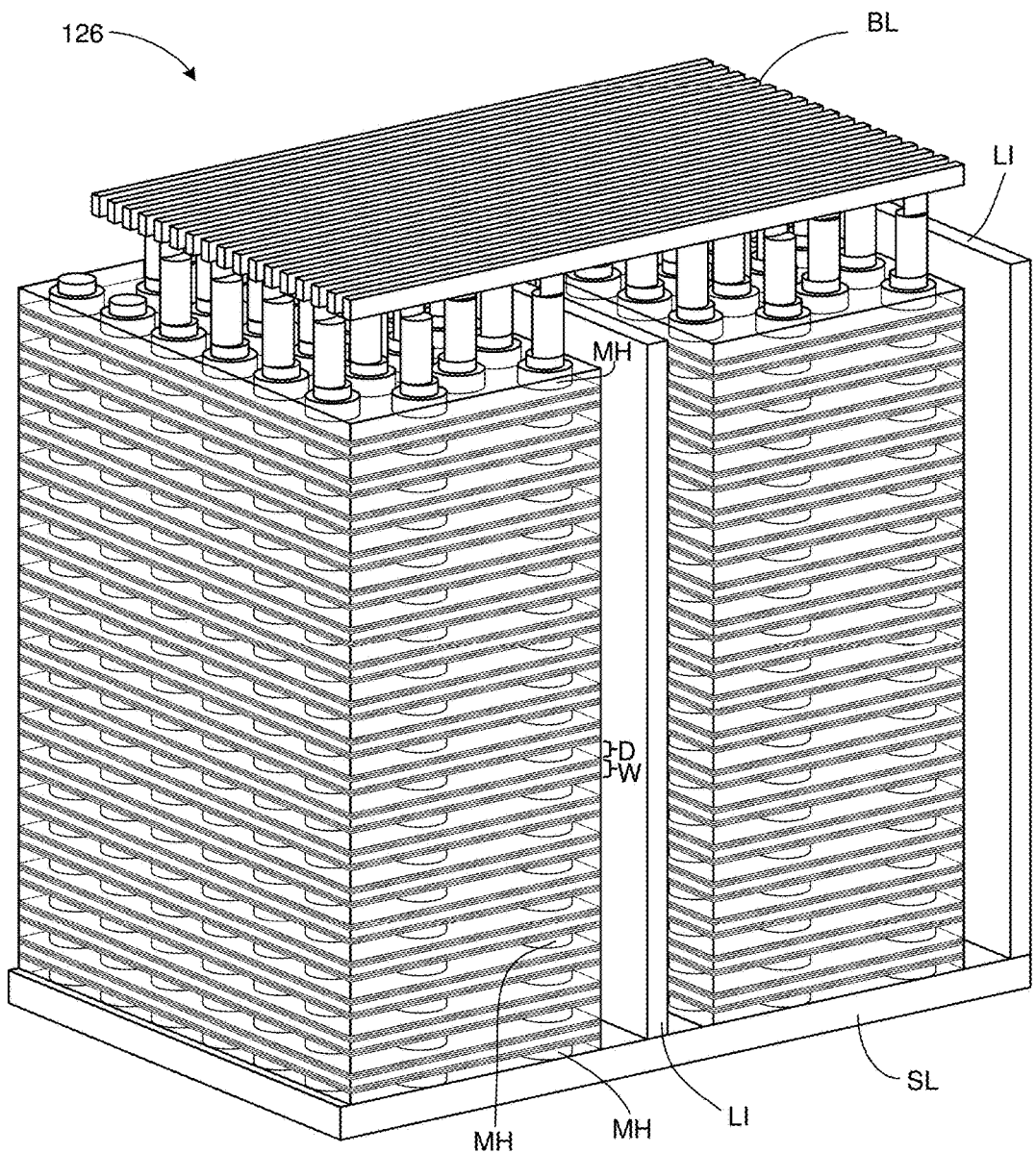
FIG. 4 is a perspective view of a portion of a three dimensional monolithic memory structure.

FIG. 4 is a perspective view of a portion of a three dimensional monolithic memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL.

Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory structure 126 is provided below with respect to FIG. 4A-4G.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
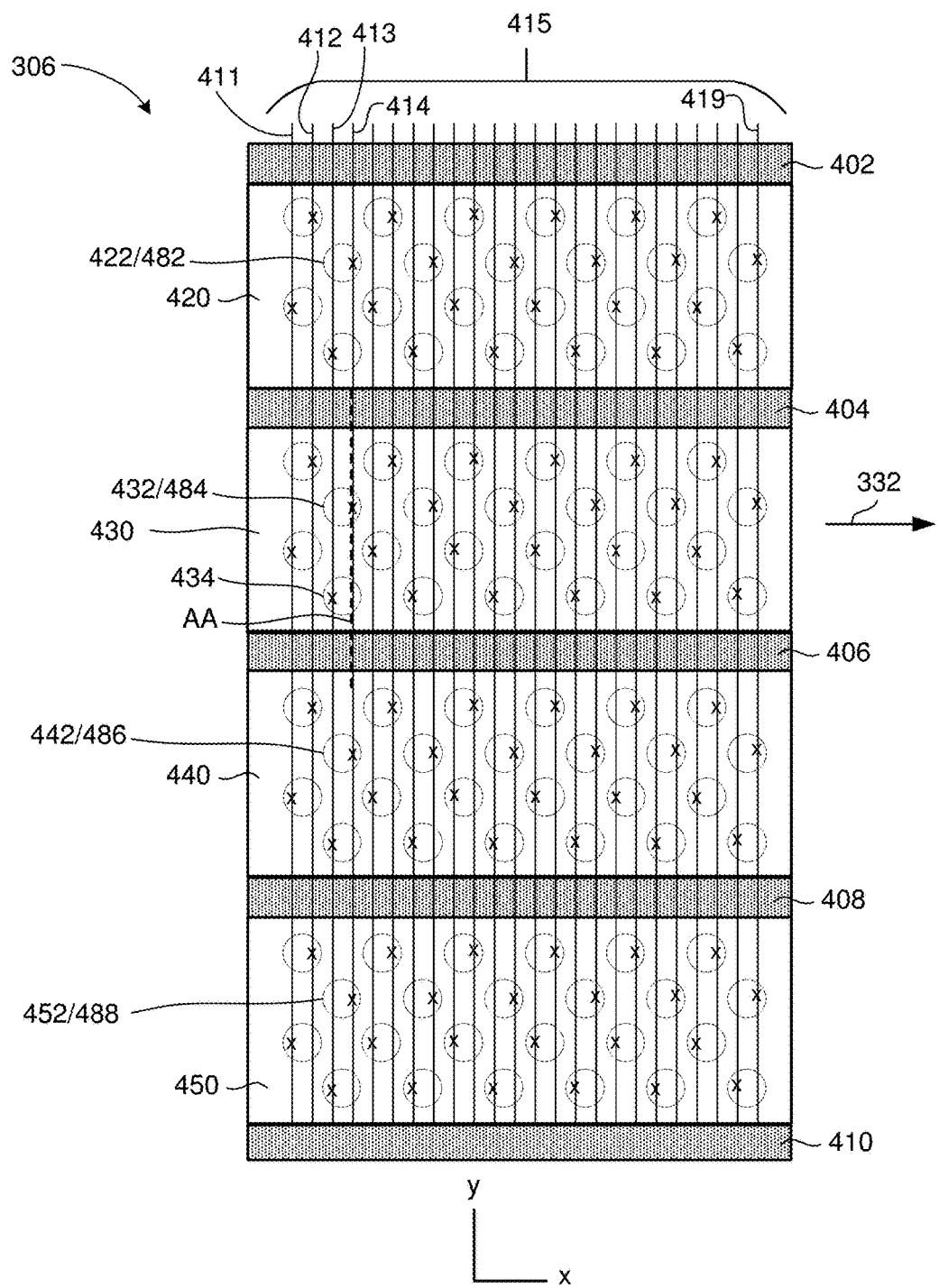
FIG. 4B depicts a top view of a portion of a block of memory cells.

FIGS. 4B-4E depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
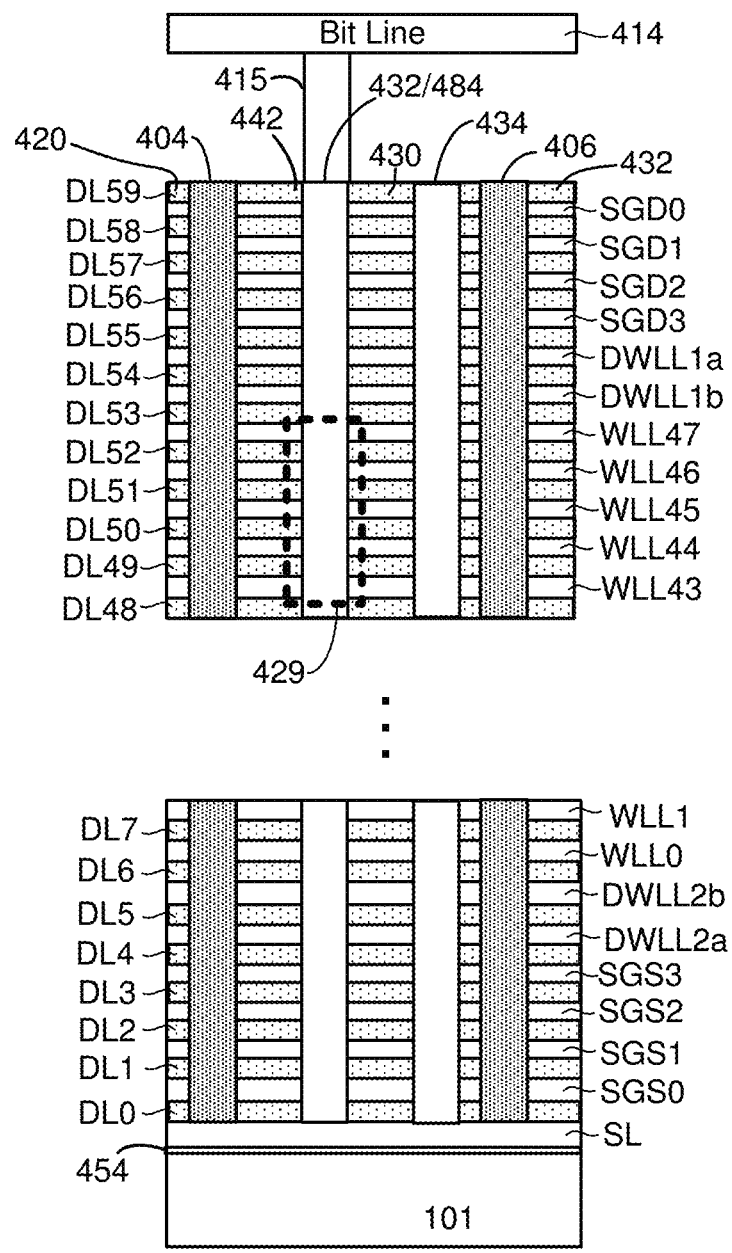
FIG. 4C depicts a cross sectional view of a portion of a block of memory cells.

FIG. 4C depicts a portion of an embodiment of three dimensional memory structure 126 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DWLL1a, DWLL1b, DWLL2a and DWLL2b; and forty eight data word line layers WLL0-WLL47 for connecting to data memory cells. Other embodiments can implement more or less than four drain side select layers, more or less than four source side select layers, more or less than four dummy word line layers, and more or less than forty eight word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DWLL1a, DWLL1b, DWLL2a and DWLL2b; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DWLL1a, DWLL1b, DWLL2a and DWLL2b connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DWLL1a, DWLL1b, DWLL2a, DWLL2b, and WLL0-WLL47) for the block that is partially depicted in FIG. 4C. As mentioned above with respect to FIG. 4B, in one embodiment local interconnects 402, 404, 406, 408 and 410 break up each conductive layers into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
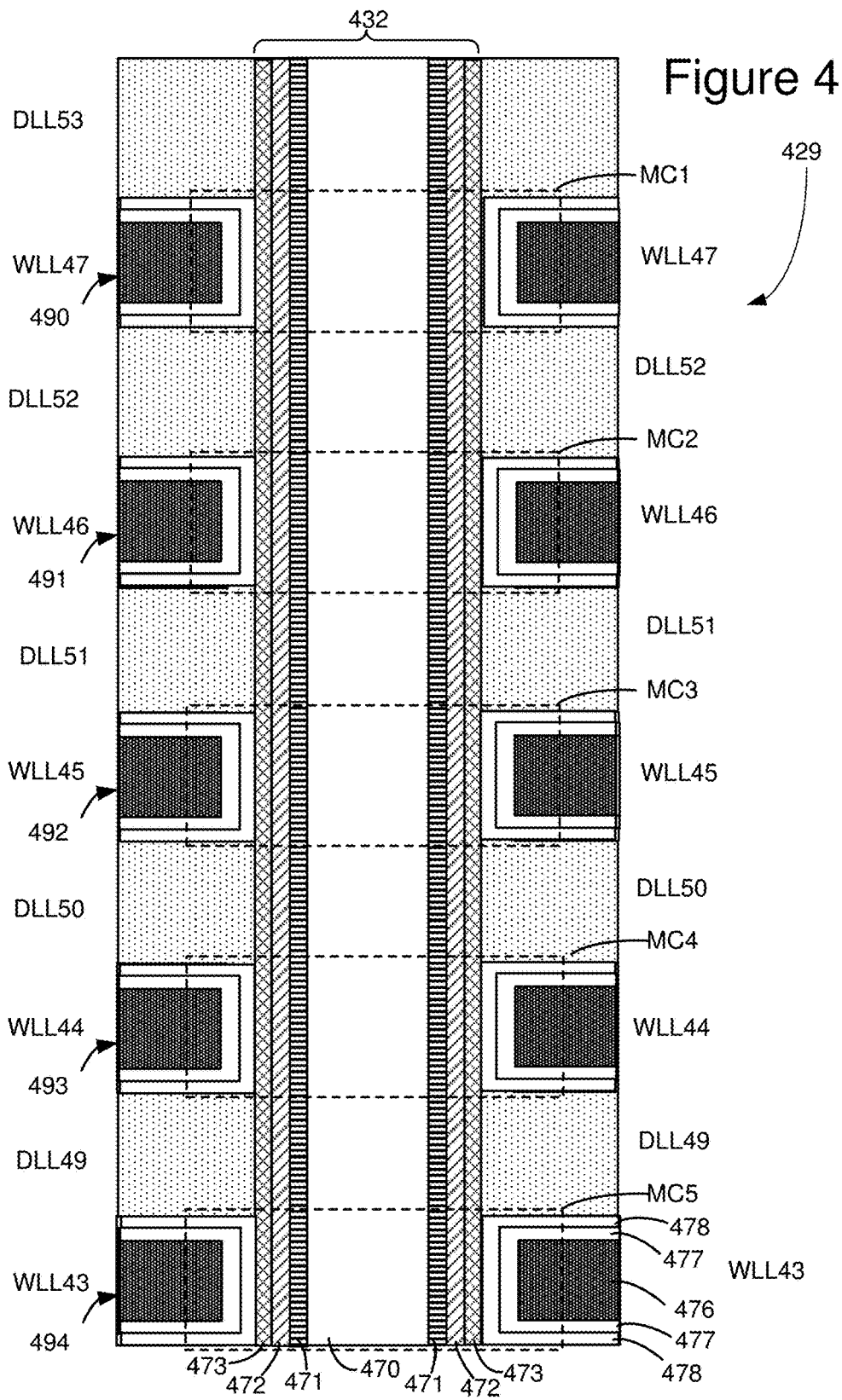
FIG. 4E is a cross sectional view of a vertical column of memory cells.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Although the example memory system discussed above is a three dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-D7 can overlap, with Controller 122 relying on ECC to identify the correct data being stored.

FIG. 5A is a table describing one example of an assignment of data values to data states. In the table of FIG. 5A, S0—111. S1=110, S2=200, S3=000, S4=010, S5=011, S6=001 and S7=101. Other encodings of data can also be used. No particular data encoding is required by the technology disclosed herein.

In some embodiment, the memory cells store multiple bit data, meaning each memory store stores more than one bit of data. For example, FIG. 5 illustrates example threshold voltage distributions for the memory cell array when each memory cell stores three bits of data. In other embodiments, the memory cells store single bit data, meaning each memory store stores one bit of data. For example, FIG. 5B illustrates example threshold voltage distributions E and P for the memory cell array when each memory cell stores one bit of data (also referred to as binary). In one embodiment, threshold voltage distributions E represents erased memory cells storing binary 1 and threshold voltage distributions P represents programmed memory cells storing binary 0. Other assignments of data can also be used.

Figure 6A:
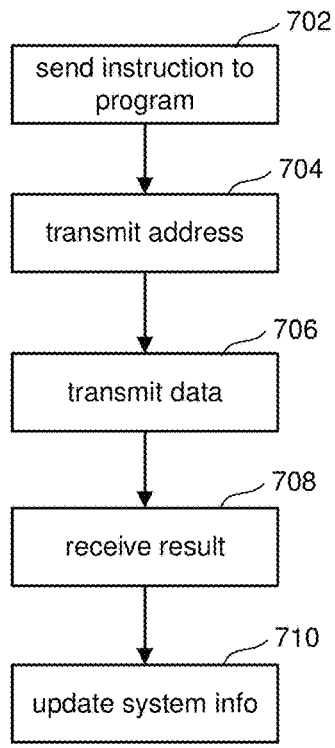
FIG. 6A is a flow chart describing one embodiment of a process for programming.

FIG. 6A is a flowchart describing one embodiment of a process for programming that is performed by the firmware running on Controller 122. In some embodiments, rather than have a dedicated Controller, the host can perform the functions of the Controller. In step 702, the firmware running on Controller 122 sends instructions to one or more memory die 108 to program data. In step 704, the firmware running on Controller 122 sends one or more logical addresses to one or more memory die 108. The one or more logical addresses indicate where to program the data. In step 706, the firmware running on Controller 122 sends the data to be programmed to the one or more memory die 108. In step 708, the firmware running on Controller 122 receives a result of the programming from the one or more memory die 108. Example results include that the data was programmed successfully, an indication that the programming operation failed, and indication that the data was programmed but at a different location, or other result. In step 710, in response to the result received in step 708, the firmware running on Controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, the firmware running on Controller 122 would receive user data and an instruction to program from the host, and the Controller would run the ECC engine to create code words from the user data. These code words are the data transmitted in step 706. Controller can also scramble the data to achieve wear leveling with respect to the memory cells.

Figure 6B:
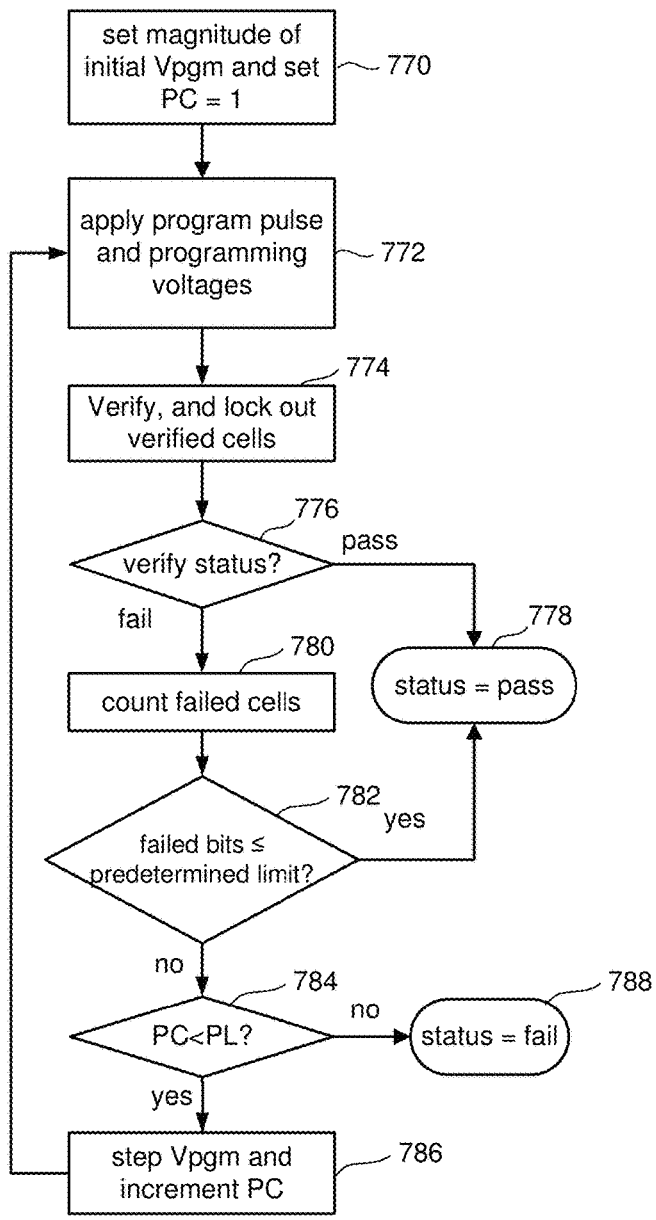
FIG. 6B is a flow chart describing one embodiment of a process for programming.

FIG. 6B is a flowchart describing one embodiment of a process for programming. The process of FIG. 6B is performed by the memory die in response to the steps of FIG. 6A (ie in response to the instructions, data and addresses from Controller 122). In one example embodiment, the process of FIG. 6B is performed on memory die 108 using the one or more control circuits discussed above, at the direction of state machine 112. The process of FIG. 6B can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 6B, the programming voltage (Vpgm) is initialized to the starting magnitude (e.g., ~12-16V or another suitable level) and a program counter PC maintained by state machine 112 is initialized at 1. In step 772, a program pulse of the program signal Vpgm is applied to the selected word line (the word line selected for programming) In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the Controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not pre-determined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 20 and 30; however, other values can be used. If the program counter PC is not less than the program limit value PL, then the program process is considered to have failed and a status of FAIL is reported in step 788. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 786, the process loops back to step 772 and another program pulse is applied to the selected word line.

In one embodiment, data is programmed in units of pages. So, for example, the process of FIG. 6B is used to program one page of data. Because it is possible that errors can occur when programming or reading, and errors can occur while storing data (e.g., due to electrons drifting, data retention issues or other phenomenon), error correction is used with the programming of a page of data.

Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the Controller receives user or host data, also referred to as information bits, that is to be stored non-volatile three dimensional memory structure 126. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in three dimensional memory structure 126 by programming one or more memory cells to one or more programming states, which corresponds to v.

In one possible implementation, an iterative probabilistic decoding process is used which implements error correction decoding corresponding to the encoding implemented in the Controller 122. Further details regarding iterative probabilistic decoding can be found in the above-mentioned D. MacKay text. The iterative probabilistic decoding attempts to decode a code word by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

The LLR for a bit is given by $$Q = \log_2 \frac{P(v=0|Y)}{P(v=1|Y)}.$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

Controller 122 receives the code word Y1 and the LLRs and iterates in successive iterations in which it determines if parity checks of the error encoding process have been satisfied. If all parity checks have been satisfied, the decoding process has converged and the code word has been error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

When manufacturing a memory system such as the non-volatile memory device 100 of FIGS. 1 and 2, the manufacturer typically performs various tests to make sure that the memory is fabricated without defects. During that testing, one or more blocks may be found to be defective. For example, there could be a short between word lines, a short between a word line and a memory hole or substrate, or other physical defect which prevents one or more of the memory cells of a block from operating without error. In traditional memory systems, if a block is discovered to have a defect, that block is marked as a bad block and will not be used. Thus, when a memory system ships, it often has a number of blocks that are marked as bad blocks that are not being utilized. It is proposed herein to use those bad blocks as a repository for non-mission critical information or other information that is suitable for storage. Since those bad blocks were already marked so that they would not be used by the system to store host data, using those bad blocks for non-critical information does not take any of the capacity of the memory system away from the host.

Figure 7:
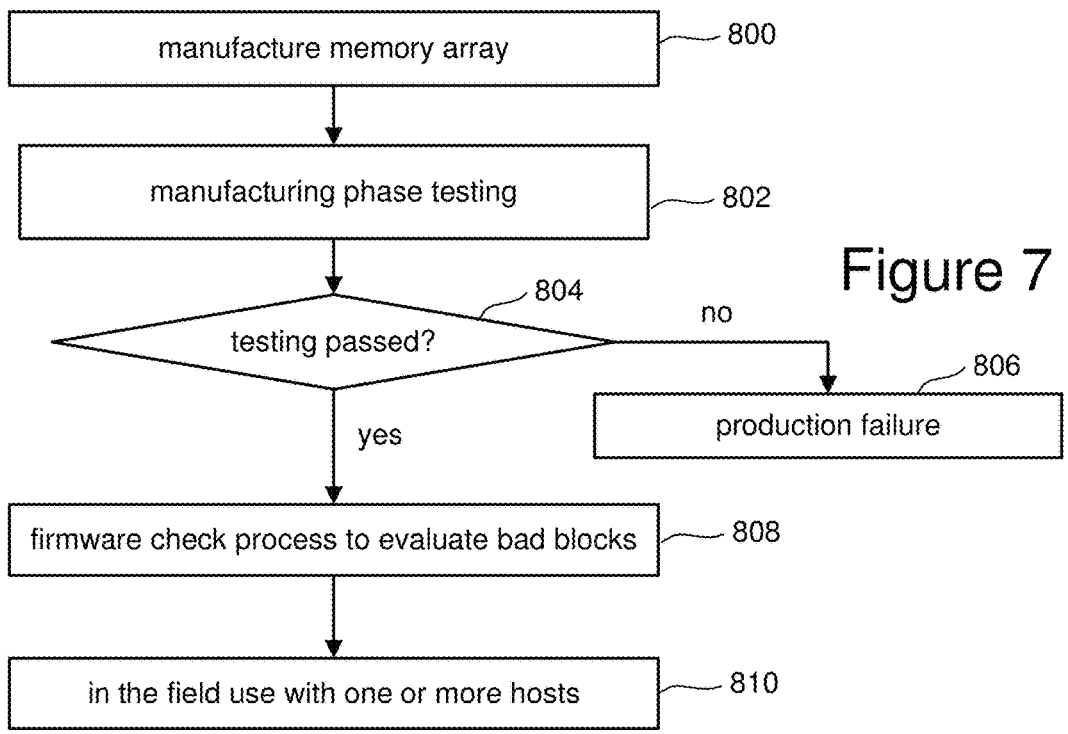
FIG. 7 is a flow chart describing one embodiment of a process for making and using non-volatile memory.

FIG. 7 is a flow chart describing one embodiment of a process for making and using non-volatile memory that includes the proposed technology for using memory blocks that have been previously identified as bad blocks as a repository for non-mission critical information or other information. In step 800 of FIG. 7, the memory array (or memory structure) will be manufactured according to methods known in the industry. In step 802, the memory structure will be subjected to testing as part of the manufacturing phase. This testing in step 802 is the standard testing performed in the industry. At least a subset of these tests are performed in order to identify bad blocks. Note in some embodiments, rather than blocks of memory cells, other groupings of memory cells can be tested. In one embodiment, a block will include 128 word lines with many memory cells connected to each word line. In other embodiments, more or less than 128 word lines can be used. If a small subset of those word lines are defective, that means that a large majority of the word lines can be used successfully. So marking an entire block as bad is wasting many word lines worth of capacity. Therefore, the proposed technology takes back those word lines that were otherwise retired so that those word lines can be used to store information for the system. Step 802 includes identifying those blocks that are defective or thought to be defective. If too many blocks are found to be defective, then the memory will not have passed the testing (step 804) and the system will conclude that there is a production failure (step 806). When there is a production failure (step 806), the memory being manufactured will be discarded. However, if only a smaller number of blocks fail the testing, then the testing would be thought of as successful (step 804) and the process will continue to step 808, during which a firmware check process will be performed that includes evaluating the bad block to see which of the bad blocks can be reclaimed to store the non-mission critical information (or other information). In step 810, the system will be used in the field, with one or more hosts, using the proposed technology for utilizing previously identified bad blocks as a repository for non-mission critical information (or other information). For example, log information can be stored in these previously identified bad blocks.

Figure 8:
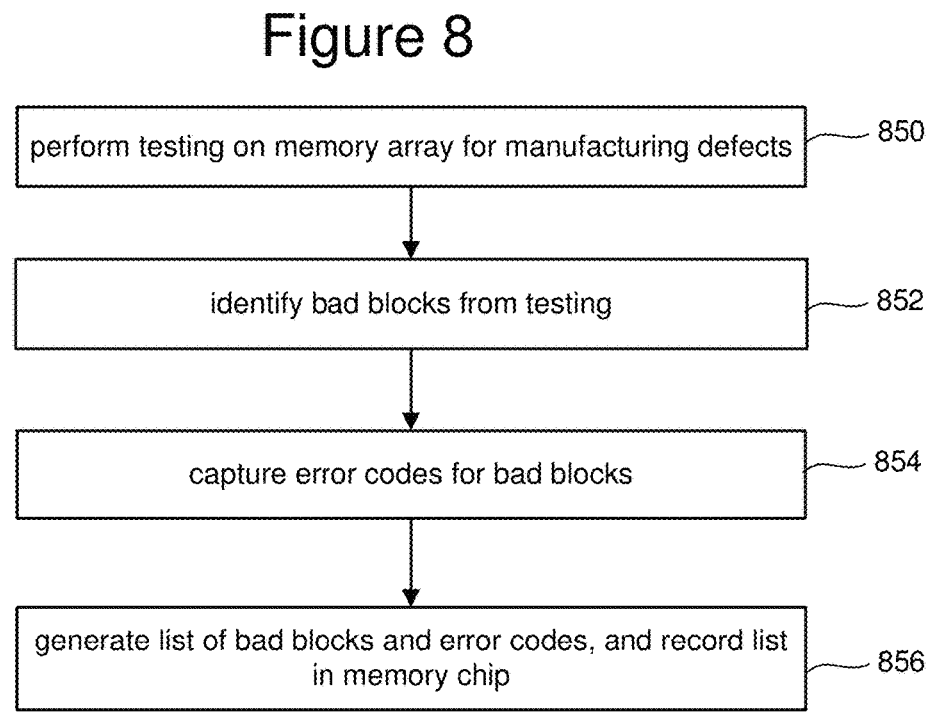
FIG. 8 is a flow chart describing one embodiment of a process for testing non-volatile memory.

FIG. 8 is a flow chart describing one embodiment of a process for testing non-volatile memory. The process of FIG. 8 is one example implementation of step 802 of FIG. 7, and is performed by test equipment in a FAB or testing center, as part of the manufacturing phase for the semiconductor memory. The testing is performed on the memory structure (e.g. memory structure 126). In step 850 of FIG. 8, the testing system perform tests on the memory structure 126 for manufacturing defects using testing methods known in the art. In step 852, the testing process identifies bad blocks based on the testing. The bad blocks are those blocks thought to have physical defects. In step 854, the testing system captures error codes for the bad blocks. The error codes indicate what defect was identified. For example, the error codes can represent a word line to word line short, control gate to substrate (or memory hole) short, programming failure, erase process failure, high failed bit count, or other defect. In step 856, the testing system generates a list of bad blocks and corresponding error codes, and records that list in the memory die 108. This list can be stored as any suitable type of data structure.

Typically, blocks intended for host data will each have a valid address for storing host data. When a block is added to the list of bad blocks, that valid address is added to the list of bad blocks. For each address in the list of bad blocks, there will be a corresponding one or more error codes that identify the one or more defects identified by the testing from step 850. In prior systems, the Controller will not program host data to any address for storing host data that resides in the list of bad blocks.

Figure 9:
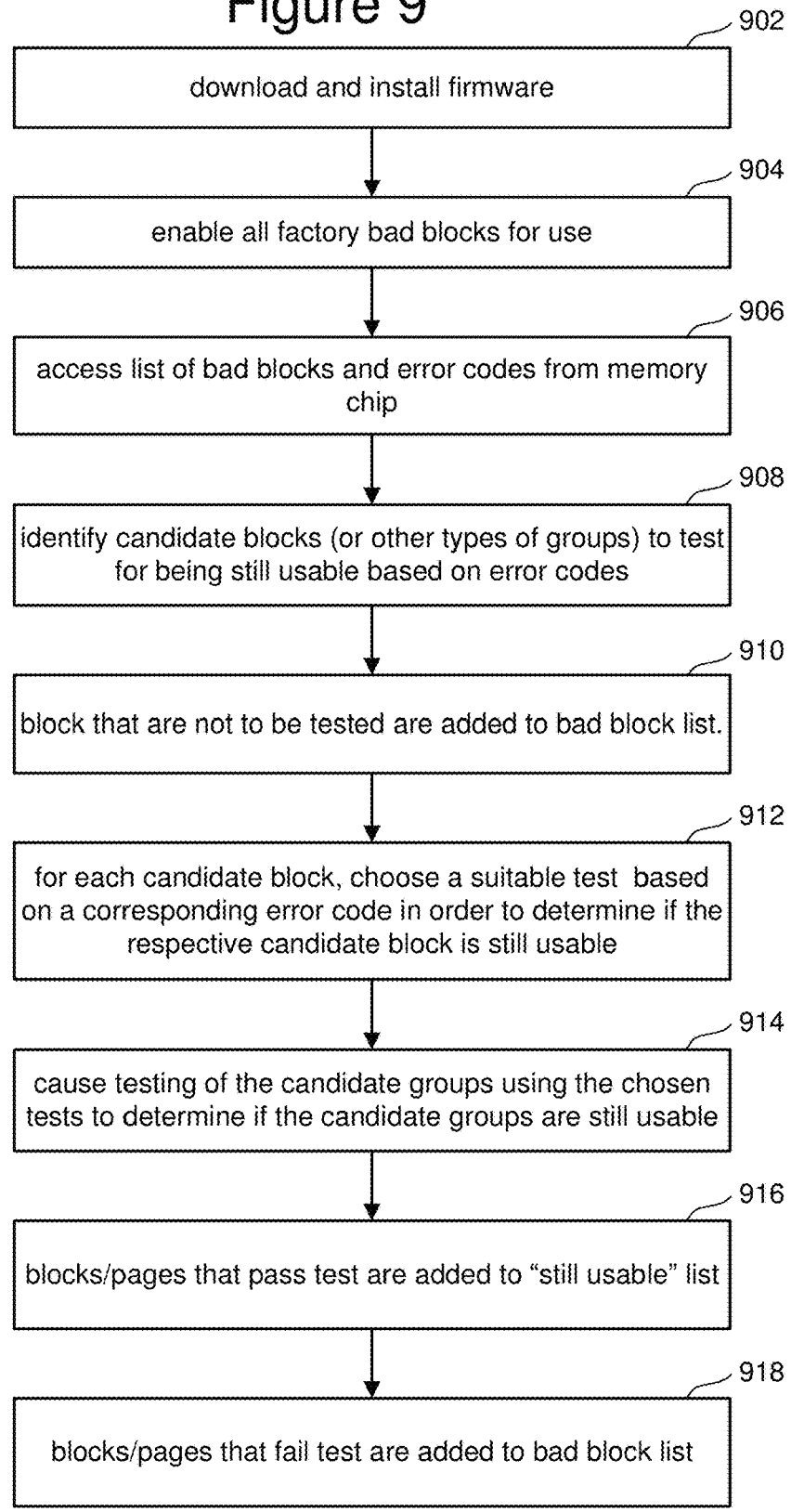
FIG. 9 is a flow chart describing one embodiment of a process for evaluating bad blocks.

FIG. 9 is a flow chart describing one embodiment of a process for evaluating the bad blocks as part of the firmware check process of step 808. In one embodiment, the process of FIG. 9 is performed by Controller 122. In another embodiment, the process of FIG. 9 can be performed by state machine 112. In other embodiments, any one or more of the one or more control circuits discussed above can be used to perform the process of FIG. 9. In some embodiments, an entity off the memory die 108 (e.g. Controller 122) can perform the process of FIG. 9 with assistance from one or more of control circuitry 110 or other components on memory die 108.

In step 902 of FIG. 9, firmware will be downloaded and installed on Controller 122. In response to downloading and installing the firmware, the firmware running on Controller 122 (or other circuits of the one or more control circuits) will begin evaluating the bad blocks. The first step performed is to enable all factory bad blocks for use in step 904. As mentioned above, at the time of testing during the manufacturing phase, the factory will create a list of bad blocks and store that list of bad blocks in the memory die 108. In one embodiment, they are stored on a ROM. In other embodiments they can be store elsewhere (e.g., in the memory structure). State machine 112 can be configured so that it will not program any data to any block in the list of bad blocks. Step 904 includes turning off (or suspending) that feature so that bad blocks can be used for programming data. In one embodiment, a command sent from Controller 122 to memory die 108 will be used to enable all factory bad blocks for use.

In step 906, the firmware running on Controller 122 accesses a list of bad blocks and error codes from memory die 108. This is the list of block addresses and corresponding error codes that were generated by the process of FIG. 8. In step 908, the firmware running on Controller 122 identifies candidate blocks of the list of bad blocks to test for being still usable based on the error codes. That is, some error codes will indicate a defect which will not allow the block to still be usable. Other error codes will indicate a defect that may possibly allow the block to be still usable or at least a portion of the block to be still usable. Those blocks that have error codes that allow the block to be still usable or possibly still be usable are identified in step 908. In embodiments which group the memory cells by groupings different than blocks, the process of FIG. 9 will operate on those types of groups rather than blocks.

In step 910, blocks that are not identified to be tested because they are not potentially still usable are added to a bad block list by the firmware running on Controller 122. In other embodiments, those blocks not being tested will just remain in the bad block list that the firmware running on Controller 122 received from memory die 108. In one embodiment, the bad block list is stored on memory die 108 and copied by the firmware running on Controller 122 when Controller 122 powers up. In step 912, for each candidate block identified in step 908, Controller 122 (ie the firmware running on the Controller) will choose a suitable test of a plurality of tests based on the corresponding error code. This test chosen will be used to determine if the respective candidate block is still usable. Different defects will require different tests to see if the blocks will be usable. Based on the defect identified by the error code, the firmware running on Controller 122 chooses the appropriate test. In step 914, the firmware running on Controller 122 causes testing of the candidate groups of memory cells using the chosen tests in order to determine if the candidate groups are still usable. In one embodiment, the tests are performed by the firmware running on Controller 122. In other embodiments, the firmware running on Controller 122 is used to oversee and manage the test using one or more commands to various circuits on memory die 108 to perform the test.

In step 916, those blocks that pass the test are added to a list of blocks that are still usable. That list of blocks that are still usable is stored in a control structure by the firmware running on Controller 122. In some embodiments, the test can be performed at the block level in order to identify those blocks that are still usable. In other embodiments, the test can be performed at the page level in order to identify a subset of pages or all pages of a block that are still usable. In some embodiments, a page of data is a unit of programming. In some embodiments, all memory cells connected to a word line are a page. In other embodiments, a word line can include multiple pages. In some embodiments that use multiple bits stored per memory cell each bit is on a separate page, while in other embodiments all the bits of a memory cell are on the same page. In step 918, blocks or pages that failed the respective test(s) of step 914 are added the bad block list stored in the control structure of the firmware running on Controller 122. If those blocks or pages are already on the bad block list, they would simply remain on the list.

As described above, the bad blocks were identified during testing as part of the manufacturing phase. In other embodiments, the system can identify bad blocks while the memory system is in use in the field. That is, the system can perform self-tests and identify bad blocks. Those bad blocks can then be subjected to the process of FIG. 9 to determine whether those bad blocks are still usable.

Figure 10:
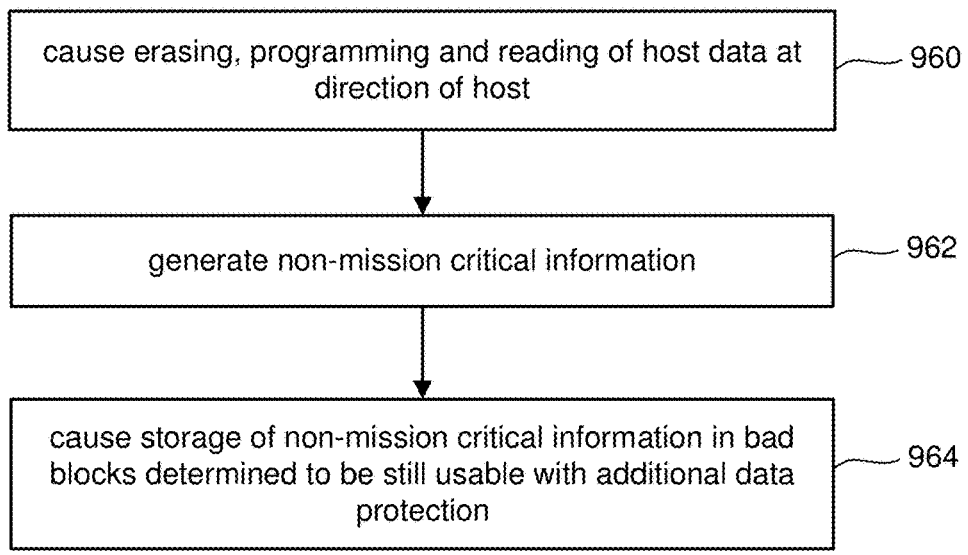
FIG. 10 is a flow chart describing one embodiment of a process for operating (in the field) the non-volatile memory system with at least some bad blocks being used.

FIG. 10 is a flow chart describing one embodiment of a process for operating (in the field) the non-volatile memory system 100 with at least some bad blocks being used to store non-mission critical information (or other types of information). That is, the process of FIG. 10 is one example implementation of step 810 of FIG. 7. In the process of FIG. 10, previously identified bad blocks or bad groups of memory cells are those blocks/groupings of memory cells that have been previously determined to be defective and previously had valid addresses for storing host data. The information to be stored is programmed into these candidate groups or candidate blocks determined to be still usable.

In step 960 of FIG. 10, the firmware running on Controller 122 cause the memory system to perform erasing, programming and/or reading of host data at the direction of the host. That is, the host will provide commands to Controller 122 to program, erase and/or read, and Controller 122 will carry out those commands by the firmware running on Controller 122 appropriately managing memory die 108. Step 960 is meant to represent general use of the memory system. In step 962, the firmware running on Controller 122 generates non-mission critical information, such as log information discussed above. While performing step 960, other types of non-mission critical information can also be generated. In step 964, the firmware running on Controller 122 causes the generated non-mission critical information to be stored in previously identified bad blocks that have been determined to be still usable. The storage of the non-mission critical information (or other types of information) in those previously determined bad blocks will be performed using additional data protection that is not otherwise used on good blocks. More detail about the additional data protection is provided below. Steps 960, 962 and 964 can be performed in any order or they can be performed concurrently. Note that in one embodiment, the firmware on Controller 122 first uses the assigned good blocks to store the non-mission critical information. When the capacity of the assigned good blocks is exhausted, the firmware obtains the bad blocks which are still usable and start to store the non-mission critical information therein.

Figure 11:
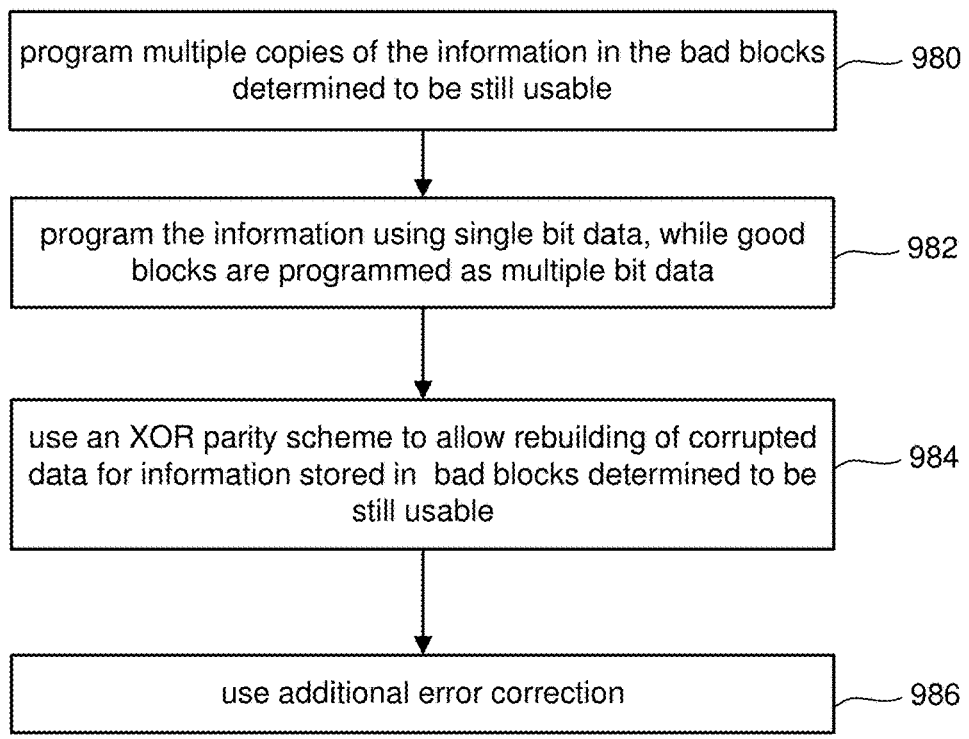
FIG. 11 is a flow chart describing one embodiment of a process for causing storage of non-mission critical information in bad blocks determined to be still usable with additional data protection.

FIG. 11 is a flow chart describing one embodiment of a process for causing the storage of non-mission critical information in bad blocks that have been determined to be still usable, with the programming being performed using additional data protection. That is, the process of FIG. 11 is one example implementation of step 964 of FIG. 10. As the process of FIG. 10 is performed by Controller 122, the process of FIG. 11 is also be performed by Controller 122. In other embodiments, the process of FIGS. 10 and 11 can be performed by any one of the one or more control circuits identified above, or other control circuitry as appropriate to the memory system.

The programming of the non-mission critical information (or other information) into memory cells is performed using the processes of FIGS. 6A and 6B. Steps 980-986 are examples of additional data protection that can be used for the programming of non-mission critical information in previously identified bad blocks, but would not normally be used when programming data into good blocks. For example, in step 980, the firmware running on Controller 122 programs multiple copies of the non-mission critical information (or other information) in different bad blocks determined to be still usable. This way, if one of the blocks fails the information will still be in a different block. In step 982, the firmware running on Controller 122 program the non-mission critical information (or other information) using single bit data (see FIG. 5B), while good blocks are programmed using multiple bit data (see FIG. 5). In step 984, the firmware running on Controller 122 uses an XOR parity scheme to allow rebuilding of corrupted data for information stored in bad blocks determined to be still usable. For example, it is known in the art to use XOR parity scheme to generate parity information which can be used to rebuild data. After programming is complete, the programmed data is read back to determine if it was corrupted. If the data is read back successfully, then the XOR parity information can be discarded. Alternatively, the XOR parity information can be saved in case the data gets corrupted later on. Using known techniques, the XOR parity information can be used to rebuild the corrupted data.

In step 986, the firmware running on Controller 122 use additional error correction. For example, different levels of error correction can be used, with a lighter version of error correction being used for good blocks and a stronger error correction that uses more bits for error code (and can correct more errors) for bad blocks. Additionally, good blocks can use one error correction process while bad blocks can use multiple error correction processes. In one embodiment, the firmware running on Controller 122 performs the programming of non-mission critical information to previously determine bad blocks using all of steps 980, 982, 984, 986. In other embodiments, only one or a subset of steps 980-986 will be utilized for any given set of data. The use of the additional data protection in FIG. 11 helps offset the risk of storing data in previously identified bad blocks. Additionally, in some embodiments, since the information stored in the previously identified bad blocks is non-mission critical information, if that information is lost the system can still operate. Thus, in one embodiment, host data (data written to the memory at the request of the host) would not be written to previously identified bad blocks. However, in other embodiments, the host data can be written to the previously identified bad blocks as discussed above.

FIGS. 12A and 12B depict a flow chart describing one embodiment of a process for evaluating bad blocks. The process depicted in FIGS. 12A and 12B is one example implementation of the process of FIG. 9. Thus, the process of FIGS. 12A and 12B is an example implementation of step 808 of FIG. 7. The process of FIGS. 12A and 12B are performed by or at the direction of Controller 122. In other embodiments, any of the one or more control circuits described above can be used to perform all or part of the process.

In step 1002 of FIG. 12A, firmware for Controller 122 is downloaded and installed on Controller 122, similar to step 902 of FIG. 9. In step 1004, the firmware running on Controller 122 enables all factory bad blocks for use, similar to step 904 of FIG. 9. In step 1006, the firmware running on Controller 122 accesses a list of bad blocks and corresponding error codes from the memory chip 108. In step 1008, the firmware running on Controller 122 stores the list of bad blocks in the control structure on the firmware loaded by Controller 122 when the memory system boots up.

In step 1010, one of the bad blocks is selected from the list of bad blocks. In step 1012, the firmware running on Controller 122 determines whether the error code corresponding to that bad block indicates that the bad block is potentially still usable. For example, if the error code indicates a failed bit count, a page level programming failure or a block level erase failure, then the block may potentially still be usable. A test needs to be performed to see if it is still usable. On the other hand, if the error indicates that there is a block level programming issue, then the bad block is not potentially still usable. If the particular bad block selected from the list in step 1010 does have a corresponding error code to indicate that it is potentially still usable, then in step 1014 the firmware running on Controller 122 records the address for that block in a list of potentially still usable blocks for further testing. In step 1016, the firmware running on Controller 122 determines whether all blocks in the list of bad blocks have been checked (step 1016). If all blocks have not been checked, the process loops back to step 1010 and the firmware running on Controller 122 selects another bad block from the list of bad blocks. If in step 1012 it is determined that the error code indicated that the block was not potentially still usable, then the process will skip step 1014 and go directly to step 1016. If it is determined in step 1016 that all blocks have been checked to see if they are potentially still usable, then the process continues on the top of FIG. 12B.

In step 1050 (see FIG. 12B), Controller select one bad block from the list of potentially still usable blocks for further testing (see step 1014). In step 1052, the firmware running on Controller 122 will choose a suitable test based on a corresponding error code. The process of FIG. 12B shows three example error codes: (1) high failure bit count (high FBC), (2) a page level programming issue, (3) a block level erase issue. In other embodiments, more or less than those three error codes can be used in the process. In this example, three error codes were used as an example to teach the concept.

If the error code in step in 1052 is determined to be a high failure bit count, then the process continues to step 1054. All pages of the block selected in step 1050 will be programmed to evaluate the failed bit count. The system will ensure that the failed bit count does not go beyond the error correction capabilities associated with the standard error correction used for good blocks or the error correction capabilities associated with additional data protection (e.g. see FIG. 11). If the block is still usable (step 1056), then in step 1058 all of the pages of the block are added to a "still usable" list. Each page can have an address associated with the page and that address is added to the list referred to as the "still usable" list, which is stored in the control data structures in the firmware running on Controller 122. In one embodiment, if the block is usable, all pages of the block are added to the list. In another embodiment, only those pages that have a small or acceptable failed bit count are added to the "still usable" list. In step 1060, it is determined whether there are more blocks to check from the list of potentially still usable blocks for further testing. If not, the process of FIG. 12B is complete and the "still usable" list is stored by the firmware running on Controller 122 in step 1062. If it is determined in step 1060 that there are more blocks to check, then the process loops back to step 1050. Additionally, if in step 1056, it is determined that the block that was tested in step 1054 is not still usable, then the process will skip 1058 and go directly to step 1060. In that case, if the block is not still usable, none of its pages will be added to the "still usable" list.

If, in step 1052, the corresponding error code indicates a page level programming issue, the process of FIG. 12B will continue to step 1070 and each page of a block under consideration is programmed separately to see which pages have defects and which pages do not have defects. In some embodiments, the programming can be performed on a word line basis such that the system will determine which word lines have defects and which word lines do not have defects. Thus, step 1070 includes the one or more control circuits determining which one or more parts of a particular bad group or bad block of the set of candidate groups or blocks is still useable and which one or more parts of the particular bad group or bad block is not still useable. In step 1072, it is determined whether any portion of that block is usable. If not, the process skips to step 1060. However, if one or more portions of the block are usable (step 1072), then in step 1074 the firmware running on Controller 122 adds those pages that passed the test of step 1072 to the "still usable" list. Subsequently, in step 1060, the firmware running on Controller 122 determine whether there are more blocks to check.

If, in step 1052, the corresponding error code indicates a block level erase issue, then the process will continue with a test at step 1080. That is, Controller 122 will cause the performing of an erase process on the block. the firmware running on Controller 122 evaluates the failed bit count for the erase process. In one embodiment, all memory cells should be storing data "111" in an embodiment where the memory cells each stored three bits of data. The system will determine how many bits failed. If the number of failed bits is less than the amount that can be corrected by error correction (standard error correction or error correction using the additional data protection), then the block is still usable (step 1082) and in step 1084 all pages that are still usable (or the entire block) can be added to the still usable list. After step 1084, the process will continue at step 1060 to determine whether there are more blocks to check. At the end of the process of FIGS. 12A and 12B, there will be a list of still usable blocks or pages that will be used to store non-mission critical information (or other types of information).

In one embodiment, prior to storing the "still usable" list in step 1062, the firmware running on Controller 122 prioritizes the list. The pages on the "still usable" list can then be used based on that. For example, blocks with pages that have been tested to have a lowest failed bit count can be used first followed by pages that have higher failed bit counts. Similarly, blocks that have all good word lines except two word lines marked bad due to word line to word line short can have a higher priority than other blocks which have less good word lines in the block. This allows for increase in storage space in addition to the resiliency of the data.

In summary, looking back at FIGS. 12A and 12B, Controller 122 determines candidate bad blocks to test for usability based on previously recorded error codes in steps 110-116. Controller 122 will cause testing to candidate bad blocks for usability in steps 1050-1060.

One embodiment includes a non-volatile storage system, comprising: a plurality of memory cells; and one or more control circuits in communication with the memory cells. The one or more control circuits are configured to access an identification of a plurality of bad groups of memory cells and corresponding error codes. The one or more control circuits are configured to identify candidate groups of the plurality of bad groups that are potentially still usable based on the error codes. The one or more control circuits configured to cause testing of the candidate groups to determine if the candidate groups are still usable. The one or more control circuits are configured to cause storage of information in candidate groups determined to be still usable by the testing.

One embodiment includes a non-volatile storage system, comprising a Controller circuit configured to communicate with a plurality of memory cells. The Controller circuit is configured to cause testing of a first bad block of memory cells to determine if the first bad block is still usable including determining which one or more parts of the first bad block is still usable and which one or more parts of the first bad block is not still usable. The Controller circuit is configured to cause storage of information in the one or more parts of the first bad block that is determined to be still usable.

One embodiment includes a method of operating a non-volatile storage system, comprising: accessing an identification of a plurality of bad blocks of non-volatile memory cells and corresponding error codes; for each bad block in at least a subset of the plurality of bad blocks, determining a test from a plurality of tests based on a corresponding error code in order to determine if the bad block is still usable; and storing information in bad blocks determined to be still usable.

One embodiment includes a non-volatile storage system, comprising: means for determining candidate bad blocks to test for usability based on previously recorded error codes; means for causing testing of the candidate bad blocks for usability; and means for causing storage of information in candidate blocks determined to be still usable. For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage system, comprising:
a plurality of memory cells; and
one or more control circuits in communication with the memory cells, the one or more control circuits configured to generate non-mission critical information, the one or more control circuits configured to access an identification of a plurality of bad groups of memory cells and corresponding error codes of a plurality of different types of error codes indicating why the bad groups are bad, for each bad group of the plurality of bad groups the one or more control circuits are configured to choose and perform a test from a plurality of different types of tests based on a corresponding error code of the different types of error codes in order to determine if the bad group is still usable, the one or more control circuits configured to cause storage of the non-mission critical information in bad groups determined to be still usable.

2. The non-volatile storage system of claim 1, wherein:
the bad groups of memory cells are blocks of memory cells that have been determined to be defective and previously had valid addresses for storing host data.

3. The non-volatile storage system of claim 1, wherein:
the non-mission critical information is data which is not required for normal device operation.

4. The non-volatile storage system of claim 1, wherein:
the one or more control circuits configured to prioritize bad groups determined to be still usable and use the bad groups determined to be still usable in an order based on priority.

5. The non-volatile storage system of claim 1, wherein:
the one or more control circuits configured to cause storage of the non-mission critical information in bad groups determined to be still usable using additional data protection that is not used on good groups.

6. The non-volatile storage system of claim 5, wherein:
the additional data protections include storing information as single bit data in bad groups determined to be still usable while good groups of memory cells store information as multiple bit data.

7. The non-volatile storage system of claim 5, wherein:
the additional data protections include programming multiple copies of data in the bad groups determined to be still usable.

8. The non-volatile storage system of claim 1, wherein:
the one or more control circuits comprise a Controller.

9. The non-volatile storage system of claim 1, wherein:
the one or more control circuits include a state machine on a same integrated circuit as the plurality of memory cells.

10. The non-volatile storage system of claim 1, wherein:
the plurality of memory cells are arranged in a three dimensional structure above a substrate.

11. A method of operating a non-volatile storage system, comprising:
accessing an identification of a plurality of bad blocks of non-volatile memory cells and corresponding error codes of a plurality of different types of error codes, the error codes indicate a type of error;
identifying which bad blocks of the plurality of bad blocks to be tested for being still usable and which blocks of the plurality of bad blocks not to be tested for being still usable based on corresponding error codes;
for each bad block identified to be tested, determining a test from a plurality of different types of tests based on a corresponding error code of the different types of error codes in order to determine if the bad block is still usable; and
storing information in bad blocks determined to be still usable.

12. The method of claim 11, further comprising:
testing blocks of non-volatile memory cells to identify the plurality of bad blocks;
capturing an error code for each block of the plurality of bad blocks that indicates why a respective block is bad; and
generating and recording a list of the plurality of bad blocks and corresponding error codes.

13. The method of claim 11, further comprising:
installing firmware on a Controller, the firmware performs the accessing and determining upon installation.

14. The method of claim 11, further comprising:
determining which one or more parts of a first bad block is still usable and which one or more parts of the first bad block is not still usable.

15. The method of claim 11, wherein:
the information is non-mission critical information.

16. A non-volatile storage system, comprising:
means for determining candidate bad blocks to test for usability based on previously recorded corresponding error codes of a plurality of different types of error codes;
means for causing testing of the candidate bad blocks including, for each candidate bad block to be tested, determining a test from a plurality of different types of tests based on the corresponding error code of the different types of error codes in order to determine if the bad block is still usable; and
means for causing storage of non-mission critical information in candidate blocks determined to be still usable without storing user data in the candidate groups.

17. The non-volatile storage system of claim 16, further comprising:
a memory means for non-volatile storing of data, the memory means includes a plurality of blocks of memory cells and an identification of a plurality of bad blocks, the candidate bad blocks are a subset of the plurality of bad blocks;
the means for determining, the means for causing testing and the means for causing storage comprise a Controller, the Controller is implemented on a first integrated circuit and the memory means is integrated on a second integrated circuit.

18. The non-volatile storage system of claim 1, wherein:

the plurality of memory cells are organized into blocks;

the bad groups of memory cells are bad blocks;

each of the blocks include multiple pages of memory cells; and the one or more control circuits configured to cause testing of bad blocks to identify pages of bad blocks that are still usable, the one or more control circuits configured to cause storage of the non-mission critical information in identified pages of bad blocks determined to be still usable by the testing.

* * * * *